US008963760B2

(12) United States Patent
Sugawa (10) Patent No.: US 8,963,760 B2
(45) Date of Patent: Feb. 24, 2015

(54) ANALOG-TO-DIGITAL CONVERTER AND SOLID-STATE IMAGING DEVICE

(71) Applicant: Shigetoshi Sugawa, Miyagi (JP)

(72) Inventor: Shigetoshi Sugawa, Miyagi (JP)

(73) Assignees: Tohoku University, Miyagi (JP); Olympus Medical Systems Corp., Tokyo (JP)

( * ) Notice: Subject to any disclaimer, the term of this patent is extended or adjusted under 35 U.S.C. 154(b) by 0 days.

(21) Appl. No.: 14/334,829

(22) Filed: Jul. 18, 2014

(65) Prior Publication Data

US 2014/0327800 A1      Nov. 6, 2014

Related U.S. Application Data

(63) Continuation of application No. PCT/JP2012/082480, filed on Dec. 14, 2012.

(30) Foreign Application Priority Data

Jan. 23, 2012  (JP) ................. 2012-011163

(51) Int. Cl.
*H03M 1/12* (2006.01)
*H04N 5/378* (2011.01)
(Continued)

(52) U.S. Cl.
CPC .............. *H04N 5/378* (2013.01); *H03M 1/124* (2013.01); *H04M 1/00* (2013.01); *H03M 1/804* (2013.01); *H03M 1/12* (2013.01)
USPC ...................................... 341/156; 341/155

(58) Field of Classification Search
CPC .......... H03M 1/00; H03M 1/12; H03M 1/804

USPC .......... 341/156, 155, 120, 172, 110, 126, 158
See application file for complete search history.

(56) References Cited

U.S. PATENT DOCUMENTS 8,358,361 B2 *   1/2013   Hasegawa ..................... 348/300

FOREIGN PATENT DOCUMENTS

JP      2007-243324 A      9/2007
JP      2008-294613 A      12/2008
(Continued)

OTHER PUBLICATIONS

International Search Report dated Jan. 15, 2013 issued in PCT/JP2012/082480.
(Continued)

*Primary Examiner* — Joseph Lauture
(74) *Attorney, Agent, or Firm* — Scully, Scott, Murphy & Presser, P.C.

(57) ABSTRACT

To obtain accurate digital data while using a successive approximation system when performing analog-to-digital conversion processing in a plurality of steps, an AD converter includes: a signal generation unit that generates a ramp voltage based on a count signal; a signal conversion unit including a circuit that holds an input signal voltage, a successive approximation capacitance group that outputs bias voltages according to a connection combination of capacitances having different capacitance values, and a unit that compares one of the ramp voltage and the bias voltage with the signal voltage; and a control unit generating a digital signal of the signal voltage based on a comparison result of the bias voltage and the comparison result of the ramp voltage while acquiring data for calibration of the capacitance group based on the connection combination and the ramp voltage.

2 Claims, 12 Drawing Sheets

(51) Int. Cl.
*H04M 1/00* (2006.01)
*H03M 1/80* (2006.01)

(56) References Cited

FOREIGN PATENT DOCUMENTS

| JP | 2009-182383 | A | 8/2009 |
| JP | 2010-004439 | A | 1/2010 |
| JP | 2010-103913 | A | 5/2010 |
| JP | 2012-054913 | A | 3/2012 |
| WO | WO 2010/109816 | A1 | 9/2010 |

OTHER PUBLICATIONS

Fang, Xiang et al., CMOS 12 bits 50kS/s Micropower SAR and Dual-Slope Hybrid ADC.

* cited by examiner

ANALOG-TO-DIGITAL CONVERTER AND SOLID-STATE IMAGING DEVICE

CROSS-REFERENCE TO RELATED APPLICATIONS

This application is a Continuation Application of International Application PCT/JP2012/082480 filed on Dec. 14, 2012, which claims priority to Japanese Application No. 2012-011163 filed on Jan. 23, 2012.

The Contents of International Application PCT/JP2012/082480 and Japanese application No. 2012-011163 are hereby incorporated by reference herein in its entirety.

TECHNICAL FIELD

The present invention relates to an analog-to-digital converter and a solid-state imaging device.

BACKGROUND ART

Conventionally, a plurality of types of analog-to-digital converters, which differ in operation system, has been known. Such an operation system includes what is called a counter-ramp system and a successive approximation system. In the counter-ramp system, a ramp voltage whose voltage value changes with a predetermined slope, and an analog signal are compared with each other by a comparator, and a digital value of the analog signal is obtained from the number of counts performed until the two voltages match each other. In the successive approximation system, a referential voltage generated by a combination of a plurality of capacitances is made to gradually approach an analog signal while the referential voltage and an analog signal are compared with each other by a comparator, and an output of the comparator at that time is obtained as a digital value of the analog signal.

An analog-to-digital converter, which digitally converts an analog signal in two steps by dividing the analog signal into higher-order bits and lower-order bits, has been known (see, e.g., Patent Literature 1).

CITATION LIST

Patent Literature

{PTL 1}
Japanese Unexamined Patent Application, Publication No. 2007-243324

SUMMARY OF INVENTION

Technical Problem

If a plurality of operation systems is combined, as in Patent Literature 1, a successive approximation system is suitable to increase the speed of the analog-to-digital converter. However, a capacitance value of a capacitance used in the successive approximation system easily varies depending on a manufacturing error. If a voltage value of a bias voltage thus becomes incorrect, accurate digital data is not obtained.

In view of the aforementioned circumstances, the present invention is directed to providing, in an analog-to-digital converter that performs analog-to-digital conversion processing in a plurality of steps, an analog-to-digital converter capable of obtaining accurate digital data while using a successive approximation system and a solid-state imaging device.

Solution to Problem

To attain the aforementioned object, the present invention provides the following means.

According to one aspect of the present invention, there is provided an analog-to-digital converter including a counter that counts clock signals in a predetermined direction and outputs a count signal, a ramp waveform signal generation unit that generates a ramp waveform signal based on the count signal, a plurality of signal conversion units, and a control unit that controls the signal conversion unit, in which each of the signal conversion units includes a sample-and-hold circuit that samples a voltage of an input signal and holds the sampled voltage, a successive approximation capacitance group that has a predetermined number of capacitances having different capacitance values that successively increase by a factor of two, and outputs bias voltages having different levels by changing connection of the capacitances, a voltage addition unit that outputs an addition voltage obtained by adding a voltage selected out of a voltage of the ramp waveform signal and the bias voltage and one of the voltage held by the sample-and-hold circuit and a predetermined referential voltage, and a comparison unit that compares a voltage not to be added serving as the other of the voltage held by the sample-and-hold circuit and the predetermined referential voltage and the addition voltage, and the control unit digitally converts the voltage held by the sample-and-hold circuit based on first digital data generated based on a result obtained by the comparison unit comparing, in a connection combination of the predetermined number of capacitances, the addition voltage obtained by the addition in the voltage addition unit with the bias voltage as the selected voltage with the voltage not to be added and second digital data generated based on a result obtained by the comparison unit comparing the addition voltage obtained by the addition in the voltage addition unit with the voltage of the ramp waveform signal as the selected voltage with the voltage not to be added while acquiring data for calibration of the successive approximation capacitance group based on the connection combination of the capacitances in the successive approximation capacitance group and the signal generated by the ramp waveform signal generation unit.

DESCRIPTION OF EMBODIMENTS

An analog-to-digital (AD) converter 1 according to an embodiment of the present invention and a solid-state imaging device 100 including the same will be described below with reference to the drawings.

Figure 1:
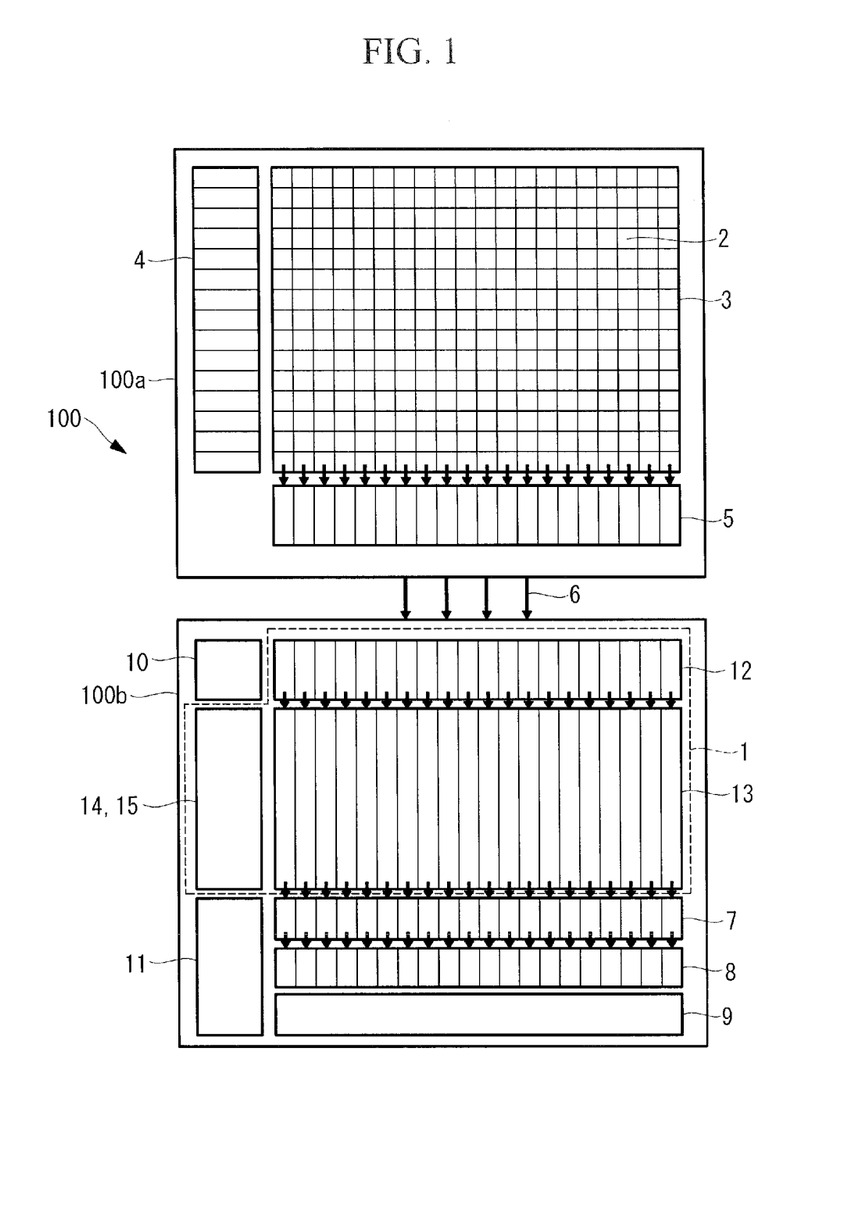
FIG. 1 is a plan view illustrating a configuration of an analog-to-digital converter according to an embodiment of the present invention and a solid-state imaging device including the same.

The solid-state imaging device 100 according to the present embodiment includes a pixel array (pixel unit) 3 having a plurality of pixels 2 arranged therein in a matrix direction, a vertical shift register 4 and a horizontal shift register 5 for reading out signal voltages from the pixels 2, an AD converter 1 for digitally converting the signal voltages read out by the shift registers 4 and 5, and a peripheral circuit provided around the AD converter 1.

The pixel array 3 and the two shift registers 4 and 5 among the components are formed on one semiconductor substrate 100a, and the other components are formed on another semiconductor substrate 100b. The semiconductor substrates 100a and 100b are stacked in their plate pressure direction. Thus, the areas of the semiconductor substrates 100a and 100b are made smaller than that when all circuits are formed on one semiconductor substrate. Therefore, an apparatus on which the solid-state imaging device 1 is loaded can be miniaturized.

Reference numeral 6 denotes a wiring for transmitting a signal from the horizontal shift register 5 on the one semiconductor substrate 100a to a sample-and-hold circuit 12 (described below) provided in the AD converter 1 on the other semiconductor substrate 100b. The same number of wirings 6 as the number of columns in the pixel array 3 may be provided to respectively correspond to the columns. Alternatively, the wiring 6 may be provided to correspond to the plurality of columns, and signals of the pixels 2 in the plurality of columns may be transmitted via the same wiring 6.

The solid-state imaging device 100 outputs the signal voltages from the pixels 2 as digital signals to the outside by the following operation.

First, the vertical shift register 4 selects the pixels 2 in the first row in the pixel array 3. The horizontal shift register 5 receives the signal voltages from the pixels 2 in the first row selected by the vertical shift register 4, and outputs the received signal voltages to the AD converter 1. Digital signals of the pixels 2 corresponding to one row, which have been obtained by conversion from the signal voltages by the AD converter 1, are stored in a memory circuit 7, are then converted from parallel signals to serial signals by a parallel-serial conversion circuit 8, and are output to an external circuit (not illustrated) from a serial digital output circuit 9 such as low voltage differential signaling (LVDS). Thus, the signal voltages from the pixels 2 in the first row are output as digital signals to the outside.

The solid-state imaging device 100 outputs the signal voltages from the pixels 2 as the digital signals to the outside row by row while shifting the rows of the pixel array 3 selected by the vertical shift register 4 row by row.

In the drawing, reference numeral 10 denotes a power supply circuit 10, and reference numeral 11 denotes a pulse generation circuit 11 that generates a pulse for driving each of the circuits.

A configuration and a function of the AD converter 1 according to the present embodiment will be specifically described below.

The AD converter 1 has a configuration in which higher-order bits of the signal voltage from the pixel 2 are digitally converted using a successive approximation system and a configuration in which lower-order bits thereof are digitally converted using a counter-ramp system. More specifically, the AD converter 1 includes a plurality of sample-and-hold circuits (signal conversion units) 12 and signal conversion circuits (signal conversion units) 13 respectively provided to correspond to the columns of the pixel array 3, a ramp waveform generation circuit (ramp waveform signal generation unit) 14 for supplying a ramp voltage (ramp waveform signal) to the signal conversion circuits 13, and a counter circuit (counter) 15 for counting clock signals.

While a configuration in which the sample-and-hold circuits 12 and the signal conversion circuits 13 are respectively provided for the columns of the pixel array 3 has been illustrated in FIG. 1, respective ones of the sample-and-hold circuits 12 and the signal conversion circuits 13 may be provided for the plurality of columns of the pixel array 3.

Figure 2:
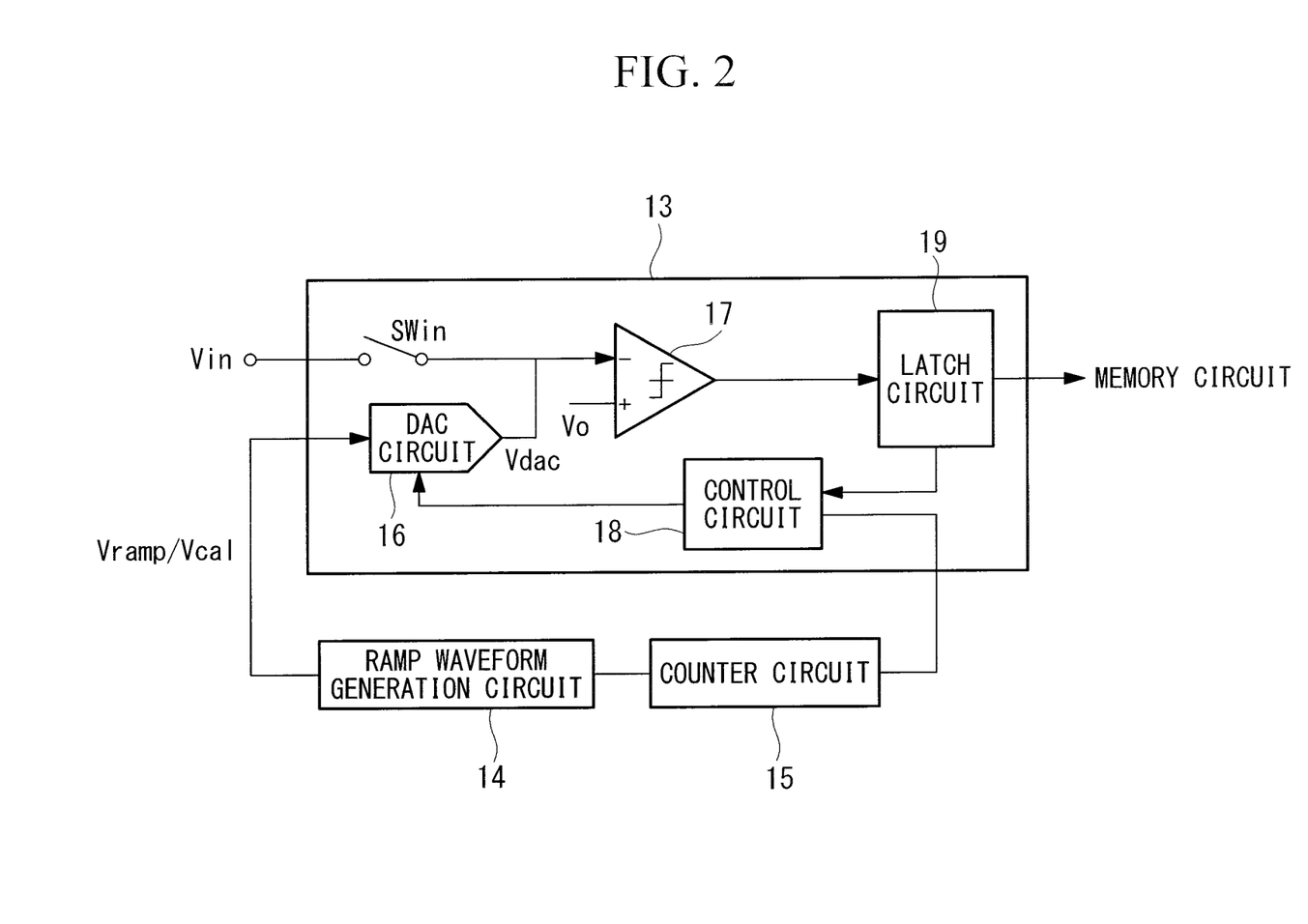
FIG. 2 is a plan view illustrating a configuration of a signal conversion circuit illustrated in FIG. 1.

FIG. 2 is a plan view illustrating a configuration of each of the signal conversion circuits 13. The signal conversion circuit 13 includes a DAC circuit (a successive approximation capacitance group, a voltage addition unit) 16, a comparator (a comparison unit) 17, and a control circuit (a control unit) 18, as illustrated in FIG. 2. An input terminal of each of the signal conversion circuits 13 is connected to the corresponding sample-and-hold circuit 12 via a switch SWin.

An output voltage Vdac from the DAC circuit 16 and a referential voltage $V_0$ are respectively input to an inversion terminal and a non-inversion terminal of the comparator 17. The referential voltage $V_0$ is, for example, 0 V. The comparator 17 compares the magnitudes of the two voltages Vdac and $V_0$. As a result of the comparison, an output of the comparator 17 becomes "high" if the voltage Vdac is less than the referential voltage $V_0$, and becomes "low" if the voltage Vdac is more than the referential voltage $V_0$. A latch circuit 19 latches a signal level output from the comparator 17. The latch circuit 19 outputs the latched signal level to the control circuit 18 and the memory circuit 7 provided in the succeeding stage of each of the signal conversion circuits 13.

The counter circuit 15 starts to perform an operation for counting clock signals generated by a clock circuit (not illustrated) based on an instruction from the control circuit 18.

The ramp waveform generation circuit 14 generates a ramp voltage Vramp, whose voltage value decreases with a predetermined slope in a time axis direction, and outputs the generated ramp voltage Vramp to the DAC circuit 16 in synchronization with the start of the counting operation by the counter circuit 15.

Figure 3:
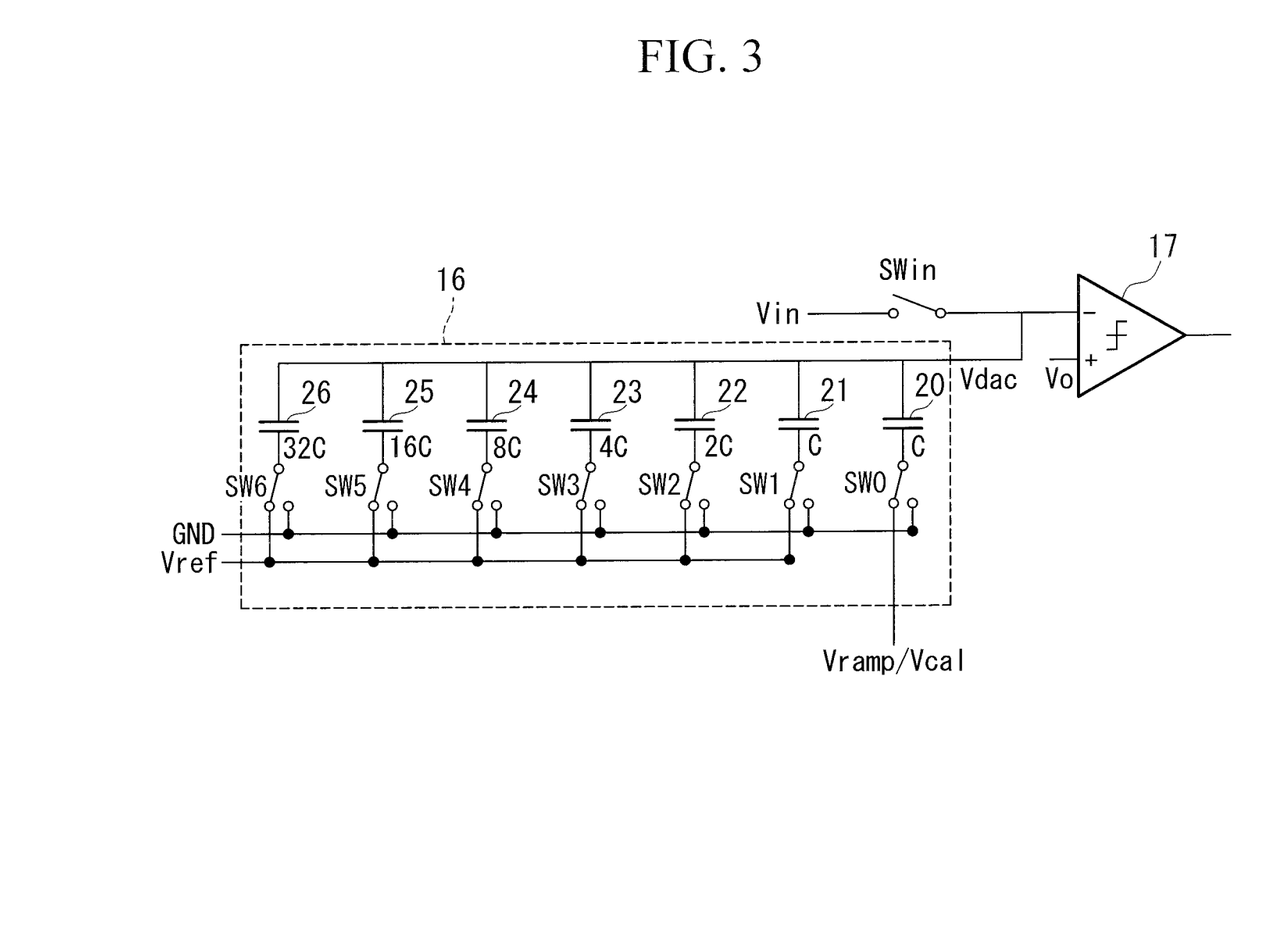
FIG. 3 is a plan view illustrating a configuration of a digital-to-analog converter (DAC) circuit illustrated in FIG. 1.

FIG. 3 is a plan view illustrating a configuration of the DAC circuit 16. FIG. 3 illustrates a configuration in which 5-bit digital data is generated. In this configuration, the DAC circuit 16 includes seven capacitances 20 to 26 and switches SW0 to SW6 respectively provided to correspond to the capacitances 20 to 26. Capacitance values of the capacitances 20 to 26 are, when the smallest capacitance values of the capacitances 20 and 21 are set to C (C is a positive constant), respectively C, C, 2C, 4C, 8C, 16C, and 32C.

Upper-side electrodes of the capacitances 20 to 26 are connected in parallel with the switch SWin and the inversion input terminal of the comparator 17. A lower-side electrode of the one capacitance 20 having the smallest capacitance value C is connected to a ramp input terminal to which a ramp voltage Vramp is input from the ramp waveform generation circuit 14 or a ground voltage GND by switching of the switch SW0. Lower-side electrodes of the other capacitances 21 to 27 are connected to a reference voltage Vref or the ground voltage GND by switching of the switches SW1 to SW6. The control circuit 18 controls the switching of the switches SW0 to SW6.

Figure 4:
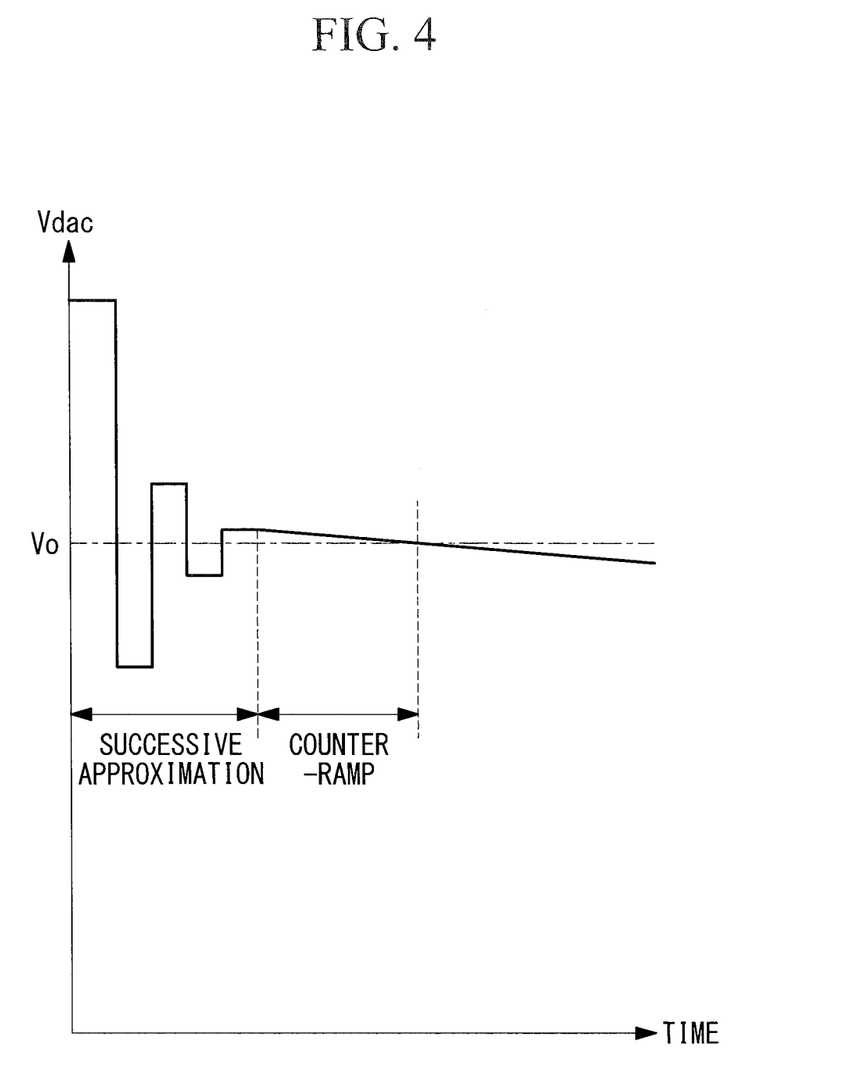
FIG. 4 illustrates an example of an operation of the analog-to-digital converter illustrated in FIG. 1.

The function of the AD converter 1 thus configured will be described below using an example illustrated in FIG. 4.

The signal voltages Vin from the pixels 2 corresponding to one row, which have been read out by the horizontal shift register 5, are respectively input to the sample-and-hold circuits 12 in the corresponding columns and held in the sample-and-hold circuits 12. The switch SWin is then closed so that the sample-and-hold circuits 12 respectively output the signal voltages Vin to the signal conversion circuits 13 in the corresponding columns in the succeeding stage. At this time, the control circuit 18 switches the switches SW0 to SW6 toward the ground voltage GND. Thus, the output voltage Vdac of the DAC circuit 16 becomes equal to the signal voltage Vin. Then, the switch SWin is opened so that the output voltage Vdac of the DAC circuit 16 is held at Vin.

The control circuit 18 then switches the switches SW1 to SW6 based on the signal received from the latch circuit 19, and the comparator 17 compares the voltage Vdac with the referential voltage $V_0$, to digitally convert the five higher-order bits of the signal voltage Vin.

More specifically, the switch SW6 corresponding to the capacitance 26 having the largest capacitance value 32C is first switched toward the reference voltage Vref. Thus, the output voltage Vdac of the DAC circuit 16 becomes Vin−Vref/2. The comparator 17 compares the output voltage Vdac with the referential voltage $V_0$. In FIG. 4, Vdac>$V_0$, i.e., Vin<Vref/2+$V_0$. An output signal of the comparator 17 becomes "low", and "0" is obtained as a digital value of the highest-order bit. The latch circuit 19 latches this signal level, and outputs the latched signal level to the control circuit 18 and the memory circuit 7.

The control circuit 18 then receives an input of "low" from the latch circuit 19, to keep the switch SW6 connected to the reference voltage Vref and switch the switch SW5 toward the reference voltage Vref. Thus, the output voltage Vdac of the DAC circuit 16 becomes Vin−(Vref/2+Vref/4). The comparator 17 compares the output voltage Vdac with the referential voltage $V_0$. In FIG. 4, Vdac<$V_0$, i.e., Vin<Vref/2+Vref/4+$V_0$. An output signal of the comparator 17 becomes "high", and "1" is obtained as a digital value of the second highest-order bit. The latch circuit 19 latches the signal level, and outputs the latched signal level to the control circuit 18 and the memory circuit 7.

The control circuit 18 then receives an input of "high" from the latch circuit 19, to switch the switch SW5 toward the ground voltage GND and switch the switch SW4 toward the reference voltage Vref. Thus, the output voltage Vdac of the DAC circuit 16 becomes Vin−(Vref/2+Vref/8). The comparator 17 compares the output voltage Vdac with the referential voltage $V_0$. In FIG. 4, Vdac>$V_0$, i.e., Vin<Vref/4+Vref/8+$V_0$. An output signal of the comparator 17 becomes "low", and "0" is obtained as a digital value of the third highest-order bit.

Thus, the control circuit 18 changes a combination of the switches SW1 to SW6 to be switched toward the reference voltage Vref according to a comparison result by the preceding comparator 17, to change bias voltages generated by the capacitances to gradually approach the signal voltage Vin, e.g., to Vref/2, Vref/2+Vref/4, Vref/2+Vref/8, . . . "0" or "1" serving as a comparison result of the signal voltage Vin and each of bias voltages is set as a digital value of the bit, to obtain digital values of the five higher-order bits.

Figure 5:
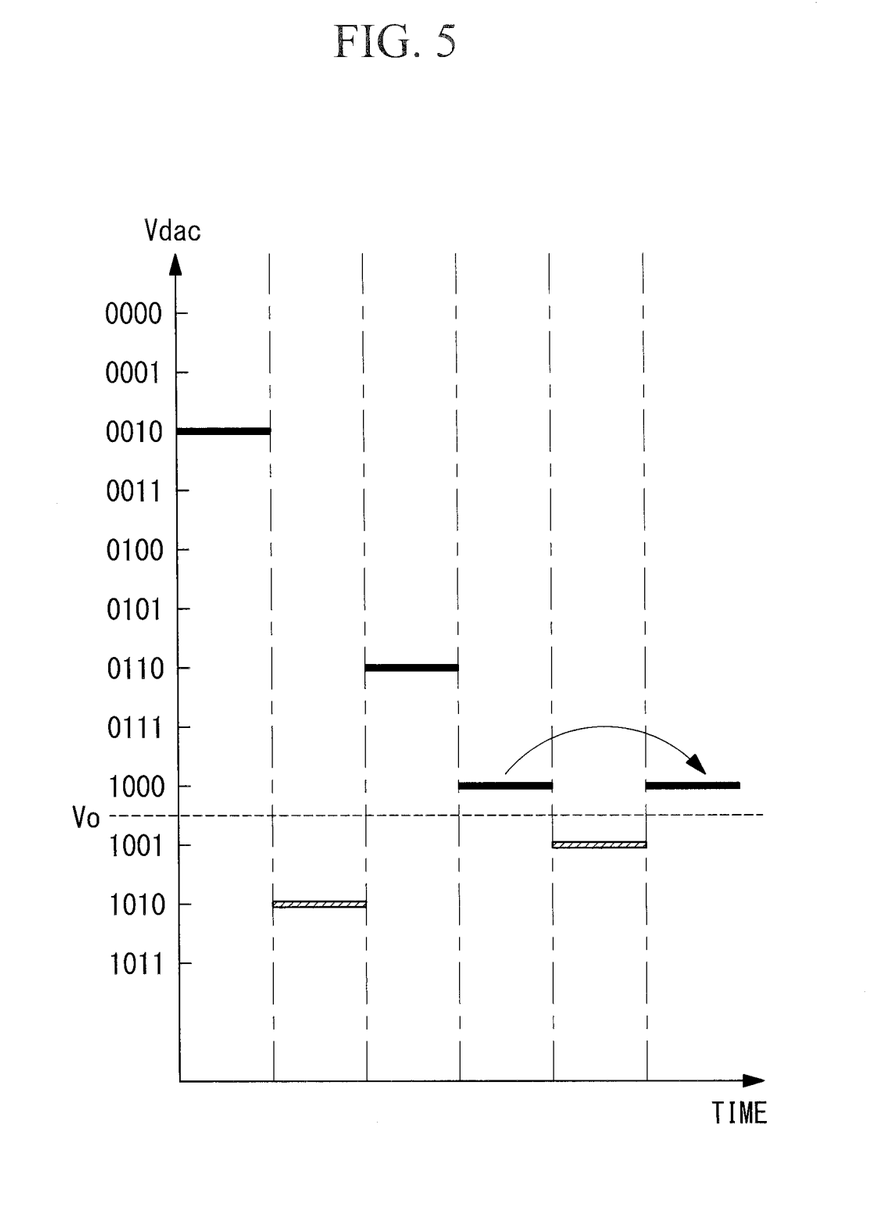
FIG. 5 illustrates an example of an operation for digital conversion of higher-order bits by the signal conversion circuit illustrated in FIG. 2.
Figure 6:
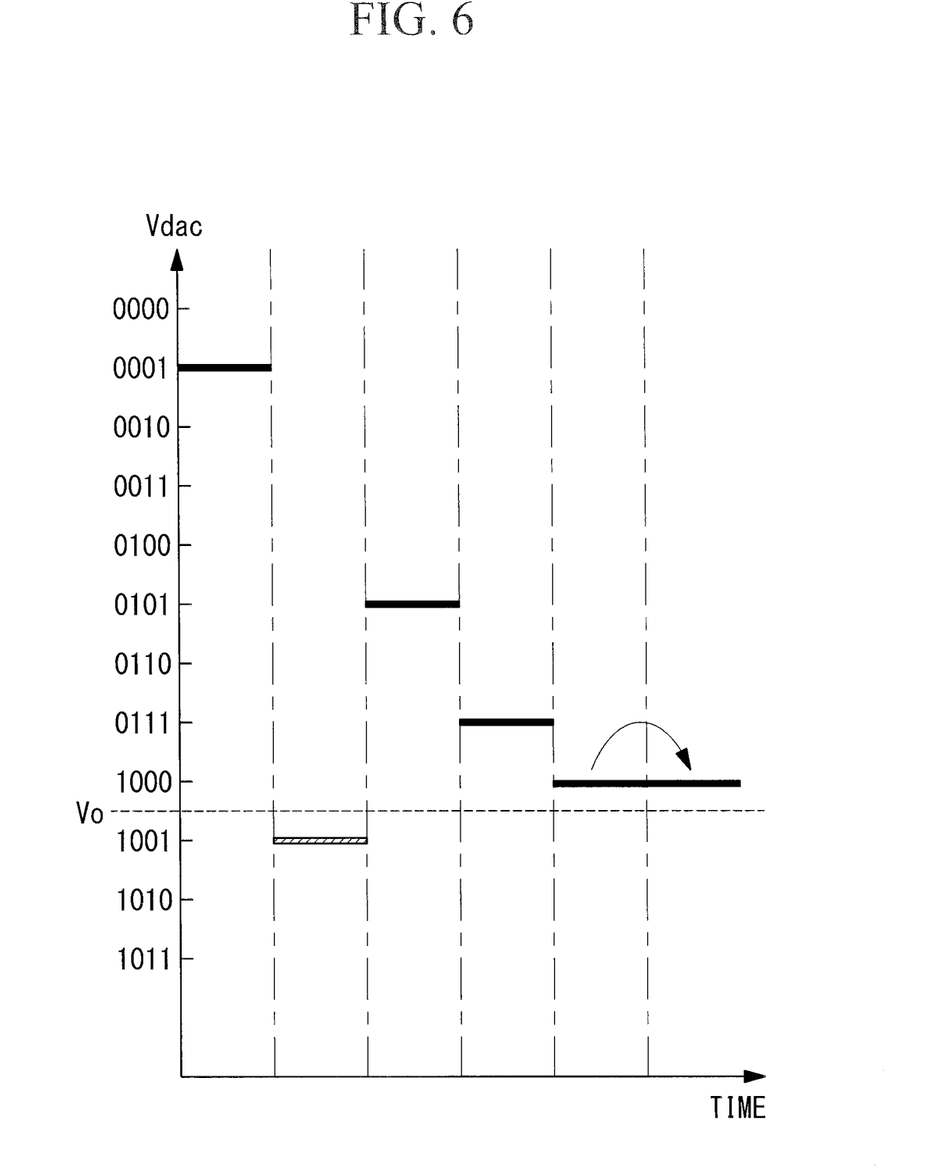
FIG. 6 illustrates another example of an operation for digital conversion of higher-order bits by the signal conversion circuit illustrated in FIG. 2.

The control circuit 18 stores digital codes of the DAC circuit 16 (see solid lines in the drawing) when the output of the comparator 17 is "0", and generates an output voltage Vdac corresponding to the digital code finally stored again after the comparison by the comparator 17 corresponding to the five higher-order bits ends, as illustrated in FIGS. 5 and 6. Thus, a digital conversion operation using the successive approximation system ends while the output voltage Vdac is higher than the referential voltage $V_0$. FIGS. 5 and 6 illustrate a case where four bits are digitally converted.

The control circuit 18 then digitally converts the lower-order bits of the signal voltage Vin using a counter-ramp system. More specifically, the control circuit 18 switches the switch SW0 corresponding to the capacitance 20 having the smallest capacitance value C toward the ramp input terminal. In addition thereto, the control circuit 18 instructs the counter circuit 15 to start to count clock signals. The ramp waveform generation circuit 14 receives the start of a counting operation by the counter circuit 15, to set an initial value as the reference voltage Vref, and output the ramp voltage Vramp that decreases with a predetermined slope. The comparator 17 compares the voltage Vdac to be inputted to the inversion input terminal with the referential voltage $V_0$, and outputs "low" while Vdac>Vref.

The counter circuit 15 continues to count the number of clock signals while "low" is input from the latch circuit 19. When the input from the latch circuit 19 is changed to "high", the counter circuit 15 stops the counting. The number of clock signals, which has been counted by the counter circuit 15, is obtained as lower-order bit digital data of the signal voltage Vin. The counter circuit 15 outputs the counted number to the memory circuit 7.

The higher-order bit digital data and the lower-order bit digital data, which have been generated in the foregoing two steps, are coupled to each other, to obtain the digital signal having the signal voltage Vin.

Thus, according to the present embodiment, the counter-ramp system having a simple circuit configuration is used for the digital conversion of the lower-order bits while using the successive approximation system suitable for a high-speed operation so that the circuit can be miniaturized and reduced in power consumption by reducing the number of capacitances 20 to 26, which accounts for a large percentage of the whole area and a large percentage of the whole power consumption.

In the digital conversion of the higher-order bits using the successive approximation system, the last voltage Vdac output by the DAC circuit 16 is made higher than the referential voltage $V_0$ so that the ramp voltage Vramp, which decreases with time in the digital conversion using the counter-ramp system to be then performed, reliably crosses the referential voltage $V_0$. Thus, an operation for digitally converting the lower-order bits can reliably be performed.

A calibration operation for the AD converter 1 according to the present embodiment will be described below. The calibration operation may be performed every time the AD converter 1 performs the digital conversion of the signal voltage Vin, or may be performed at a timing such as the time when power to the solid-state imaging device 100 is turned on or the time when an environment such as a temperature is changed.

First, a calibration voltage Vcal having a known voltage value is applied to a lower-side polar plate of the capacitance 20 via the switch SW0, which has been switched toward the ramp input terminal, from the ramp waveform generation circuit 14. At this time, respective lower-side polar plates of the other capacitances 21 to 26 are connected to the ground voltage GND via the switches SW1 to SW6. Thus, the voltage Vdac=−Vcal is input to the inversion input terminal of the comparator 17. The calibration voltage Vcal is digitally converted, like in the digital conversion of the higher-order bits of the signal voltage Vin using the aforementioned successive approximation system. Similarly, a plurality of calibration voltages Vcal having different voltage values is digitally converted.

Digital signals of the calibration voltages Vcal obtained by the digital conversion are respectively used as data for calibration of the capacitances 20 to 26. That is, if there exists a variation due to a manufacturing error in each of the capacitance values of the capacitances 20 to 26, the digital signal obtained by actually digitally converting the calibration voltage Vcal differs from a digital signal theoretically calculated from the calibration voltage Vcal. A table in which the two digital signals are associated with each other is stored in a storage device (not illustrated) provided outside the solid-state imaging device 100. Thus, the higher-order bit digital signal obtained by the AD converter 1 can be compensated for based on the table to obtain a correct digital signal.

Thus, according to the present embodiment, the ramp waveform generation circuit 14 used for the digital conversion of the lower-order bits of the signal voltage Vin is also used to generate the calibration voltage Vcal so that a configuration for generating a calibration voltage, which has conventionally been separately provided, is not required. This enables further miniaturization to be achieved.

Figure 7:
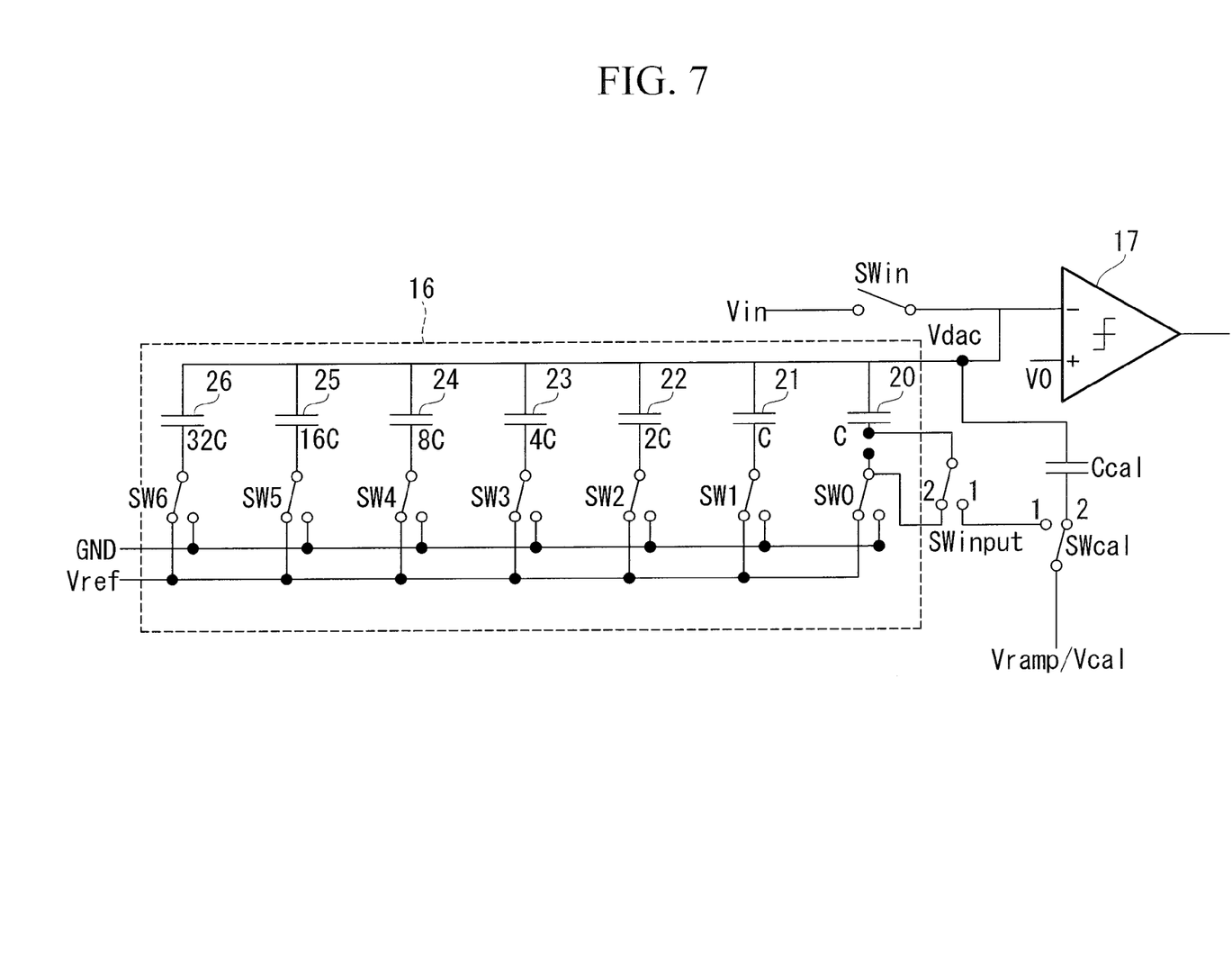
FIG. 7 is a plan view illustrating a configuration in a modification of the DAC circuit illustrated in FIG. 3.

While the ramp voltage Vramp whose voltage value decreases with time is used in the digital conversion of the lower-order bits in the present embodiment, the ramp voltage Vramp may be replaced with a ramp voltage whose voltage value increases with time. In this case, in the digital conversion of the higher-order bits, the voltage Vdac to be last output by the DAC circuit 16 may be made lower than the referential voltage $V_0$. That is, the control circuit 18 may store a digital code of the DAC circuit 16 when the output of the comparator 17 is "high", and generate the voltage Vdac corresponding to the digital code last stored again after the comparison corresponding to the five higher-order bits by the comparator 17 ends The calibration may be performed using a circuit form as illustrated in FIG. 7. In the present embodiment, if a calibration operation is started, as illustrated in a flowchart of FIG. 8, switches SWinput and SWcal are respectively switched toward "2" and "2" (step S1), and calibration is performed in order from the capacitance 26 having the largest capacitance value 32C (steps S2 to S7).

Figure 8:
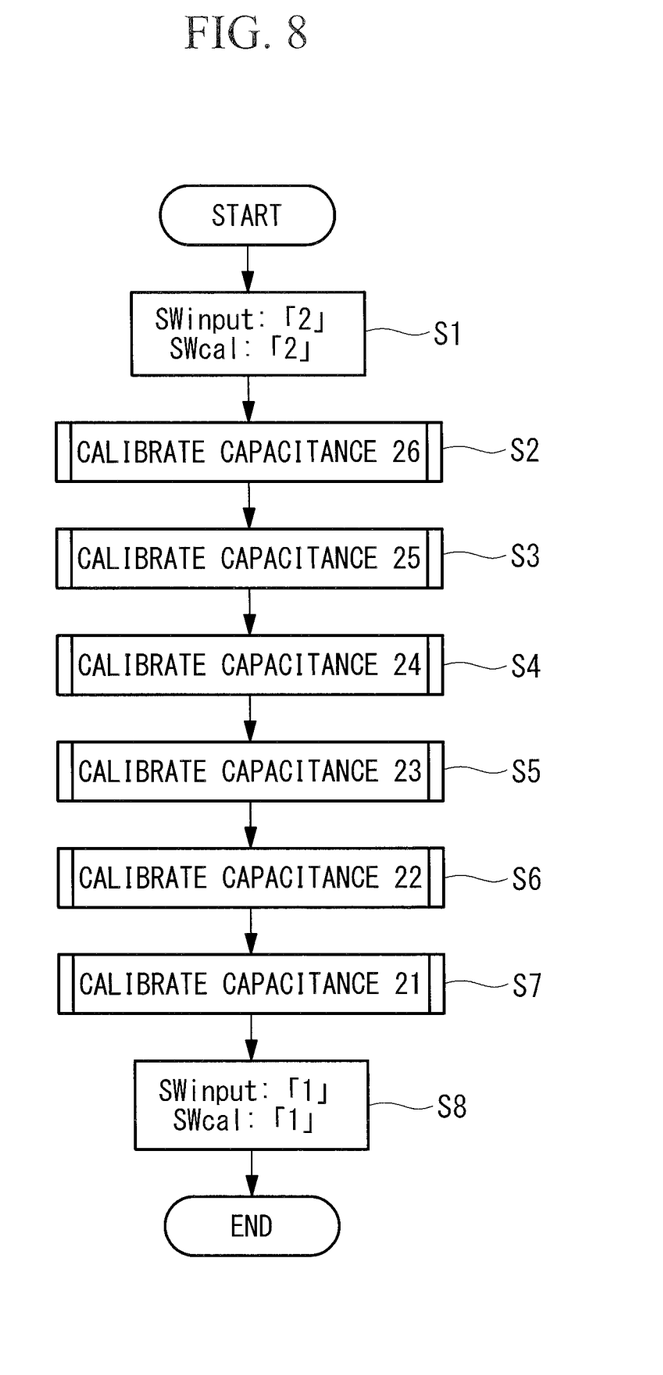
FIG. 8 is a flowchart illustrating a calibration operation by a solid-state imaging device according to the modification including the DAC circuit illustrated in FIG. 7.
Figure 9:
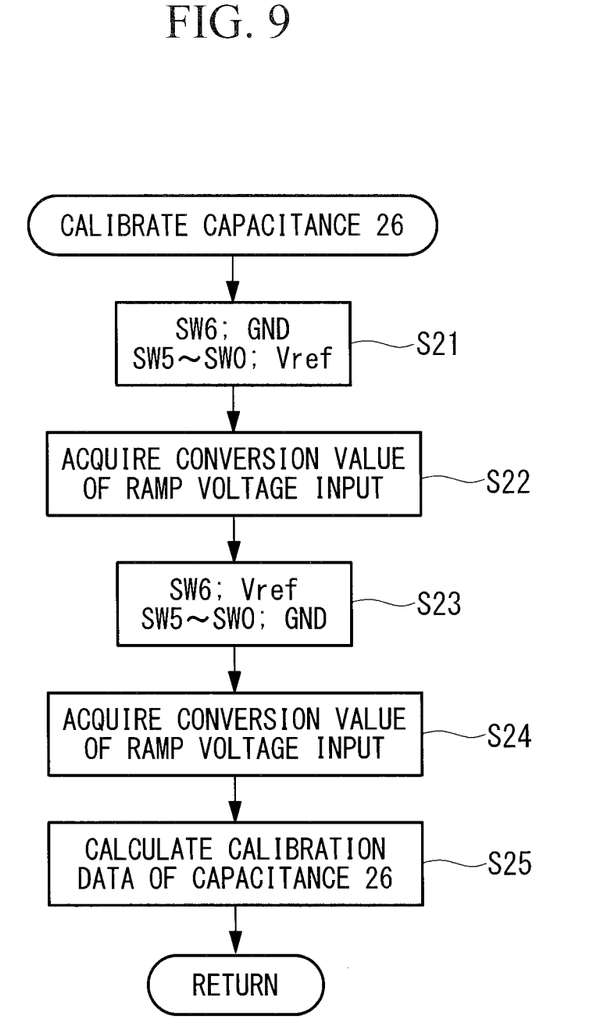
FIG. 9 is a flowchart illustrating a routine for calibrating a capacitance 26 in the flowchart illustrated in FIG. 8.

FIG. 9 illustrates a routine S2 for calibrating a capacitance 26 illustrated in FIG. 8. As illustrated in FIG. 9, the switch SW6 is connected to the ground voltage GND, and the switches SW0 to SW5 are connected to the reference voltage Vref (step S21). A voltage V261 to be input to the inversion terminal of the comparator 17 at this time is found by inputting the calibration voltage Vcal having a known voltage value from the ramp waveform generation circuit 14 via the switch SWcal (step S22).

Then, the switch SW6 is connected to the reference voltage Vref, and the switches SW0 to SW5 are connected to the ground voltage GND (step S23). A voltage V262 to be input to the inversion terminal of the comparator 17 at this time is found by inputting the calibration voltage Vcal having a known voltage value from the ramp waveform generation circuit 14 via the switch SWcal (step S24).

Then, calibration data of the capacitance 26 is calculated from the voltages 261 and 262 that have been acquired in steps S22 and S24 (step S25). More specifically, letting Ctot be the sum of the capacitance values of the capacitances 20 to 26, Ctot/2+ΔC26 be the capacitance value of the capacitance 26, and Ctot/2−ΔC26 be the capacitance values of the capacitances 20 to 25, the voltages V261 and V262 are respectively expressed by the following equations:

$$V261 = V\text{refx}(C\text{tot}/2 - \Delta C26)/C\text{tot}$$

$$V262 = V\text{refx}(C\text{tot}/2 + \Delta C26)/C\text{tot}$$

Thus, a difference between the voltages V261 and V262 is as follows:

$$V262 - V261 = V\text{refx}(2 \times \Delta C26/C\text{tot})$$

Accordingly, a conversion error due to a manufacturing error of the capacitance 26 is found as (V262−V261)/2, and is used as calibration data during conversion of the capacitance 26.

Figure 10:
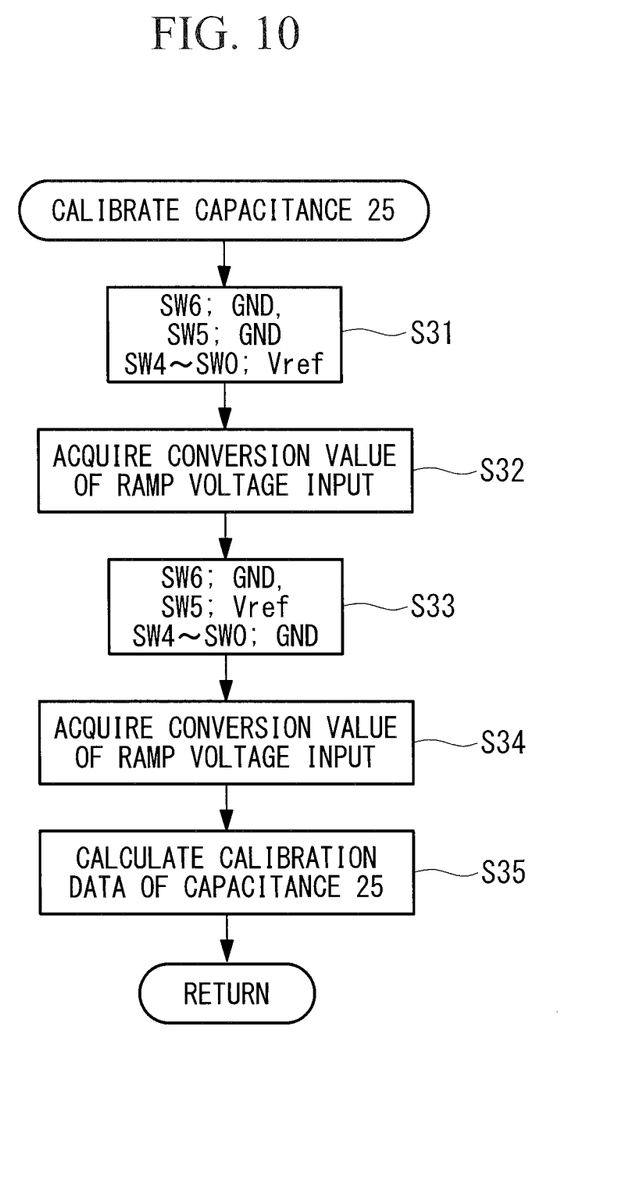
FIG. 10 is a flowchart illustrating a routine for calibrating a capacitance 25 in the flowchart illustrated in FIG. 8.

Then, the capacitance 25 is calibrated using a routine S3 for calibrating the capacitance 25 illustrated in FIG. 8. First, the switches SW6 and SW5 are connected to the ground voltage GND, and the switches SW0 to SW4 are connected to the reference voltage Vref (step S31). A voltage V251 to be input to the inversion terminal of the comparator 17 at this time is found by inputting the calibration voltage Vcal having a known voltage value from the ramp waveform generation circuit 14 via the switch SWcal (step S32).

Then, the switch SW5 is connected to the reference voltage Vref, and the switches SW0 to SW4 are connected to the ground voltage GND (step S33). A voltage V252 to be input to the inversion terminal of the comparator 17 at this time is found by inputting the calibration voltage Vcal having a known voltage value from the ramp waveform generation circuit 14 via the switch SWcal (step S34).

Then, calibration data of the capacitance 25 is calculated from the voltages 251 and 252 that have been acquired in steps S32 and S34 (step S35). More specifically, letting Ctot/4−ΔC26/2+ΔC25 be the capacitance value of the capacitance 25, and Ctot/4−ΔC26/2−ΔC25 be the sum of the capacitance values of the capacitances 20 to 24, the voltages V251 and V252 are respectively expressed by the following equations:

$$V251 = V\text{refx}(3 \times C\text{tot}/4 - \Delta C26/2 - \Delta C25)/C\text{tot}$$

$$V252 = V\text{refx}(3 \times C\text{tot}/4 - \Delta C26/2 + \Delta C25)/C\text{tot}$$

Thus, a difference between the voltage V251 and the voltage V252 is as follows:

$$V252 - V251 = V\text{refx}(2 \times \Delta C25/C\text{tot})$$

Accordingly, a conversion error due to a manufacturing error of the capacitance 25 is found as (V252−V251)/2, and is used as calibration data during conversion of the capacitance 25.

Processing is also performed for the capacitances 24 to 21 in a similar manner to that for the capacitances 25 and 26 to obtain calibration data, and the switch SWinput and the switch SWcal are respectively switched toward "1" and "1", to end calibration (step S8).

Figure 11:
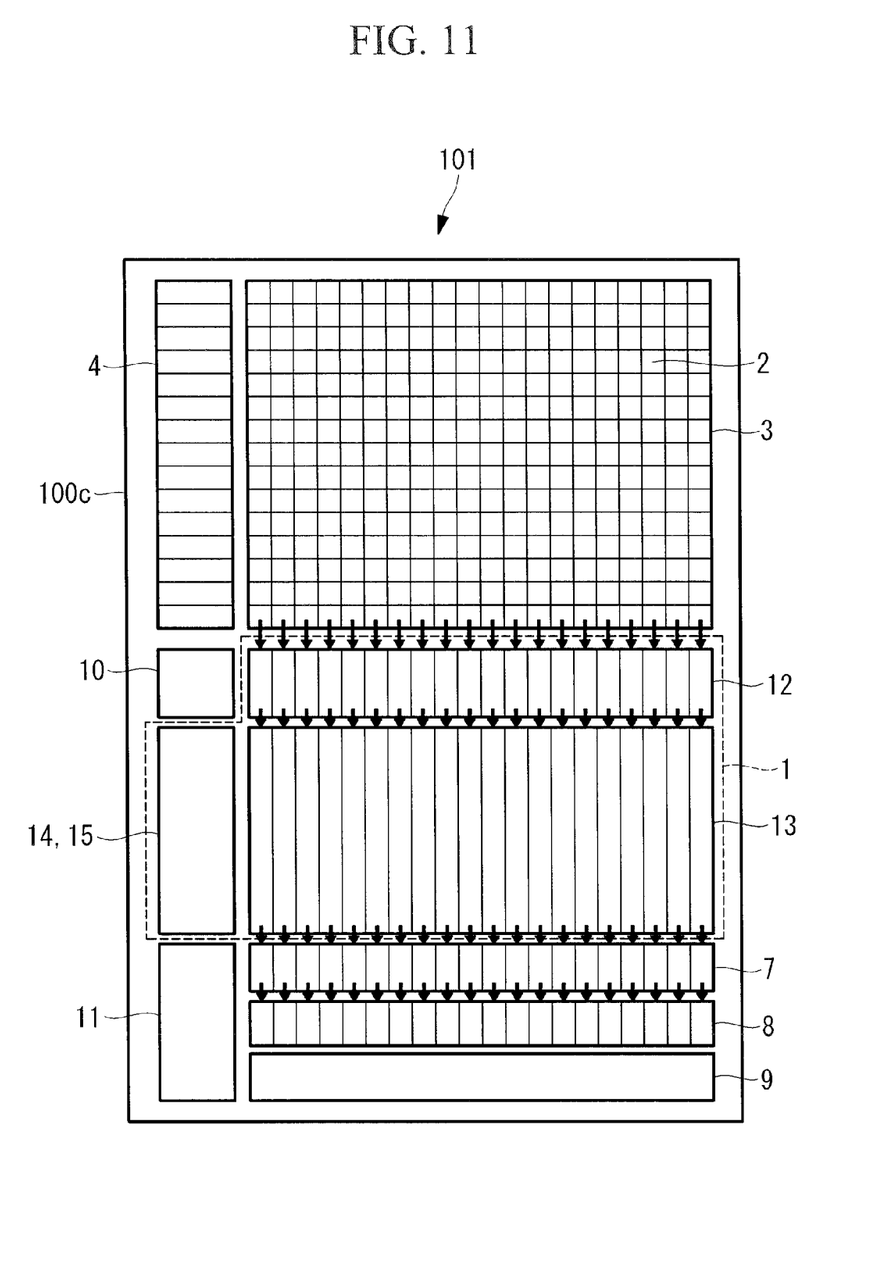
FIG. 11 is a plan view illustrating a configuration in a modification of the solid-state imaging device illustrated in FIG. 1.

While each of the circuits constituting the solid-state imaging device 100 is formed on either one of the two semiconductor substrates 100a and 100b in the present embodiment, the circuits may be formed on one semiconductor substrate 100c, as illustrated in FIG. 11, instead of this.

In an example illustrated in FIG. 11, the horizontal shift register 5 is omitted, and signal voltages Vin from pixels 2 in each column are respectively directly input to the sample-and-hold circuits 12.

While only an operation for digitally converting the signal voltages Vin from the pixels 2 has been described in the present embodiment, noise voltages of the pixels 2 may be digitally converted prior to the digital conversion of the signal voltages Vin.

When the signal voltage Vin, which the pixel 2 has, is reset to zero, the noise voltage is generated as such a reset operation is performed, and is stored in the pixel 2 after being reset. Therefore, the signal voltage Vin, which the pixel 2 has generated upon receiving light, is then superimposed on the noise voltage, and the sum of the signal voltage Vin and the noise voltage is read out by the horizontal shift register 5. The noise voltage is read out after the pixel 2 is reset, and the signal voltage Vin, which the pixel 2 has generated upon receiving light, together with the noise voltage, is then read out. The signal voltage Vin can be calculated from a difference between the signal voltage Vin and the noise voltage.

Figure 12:
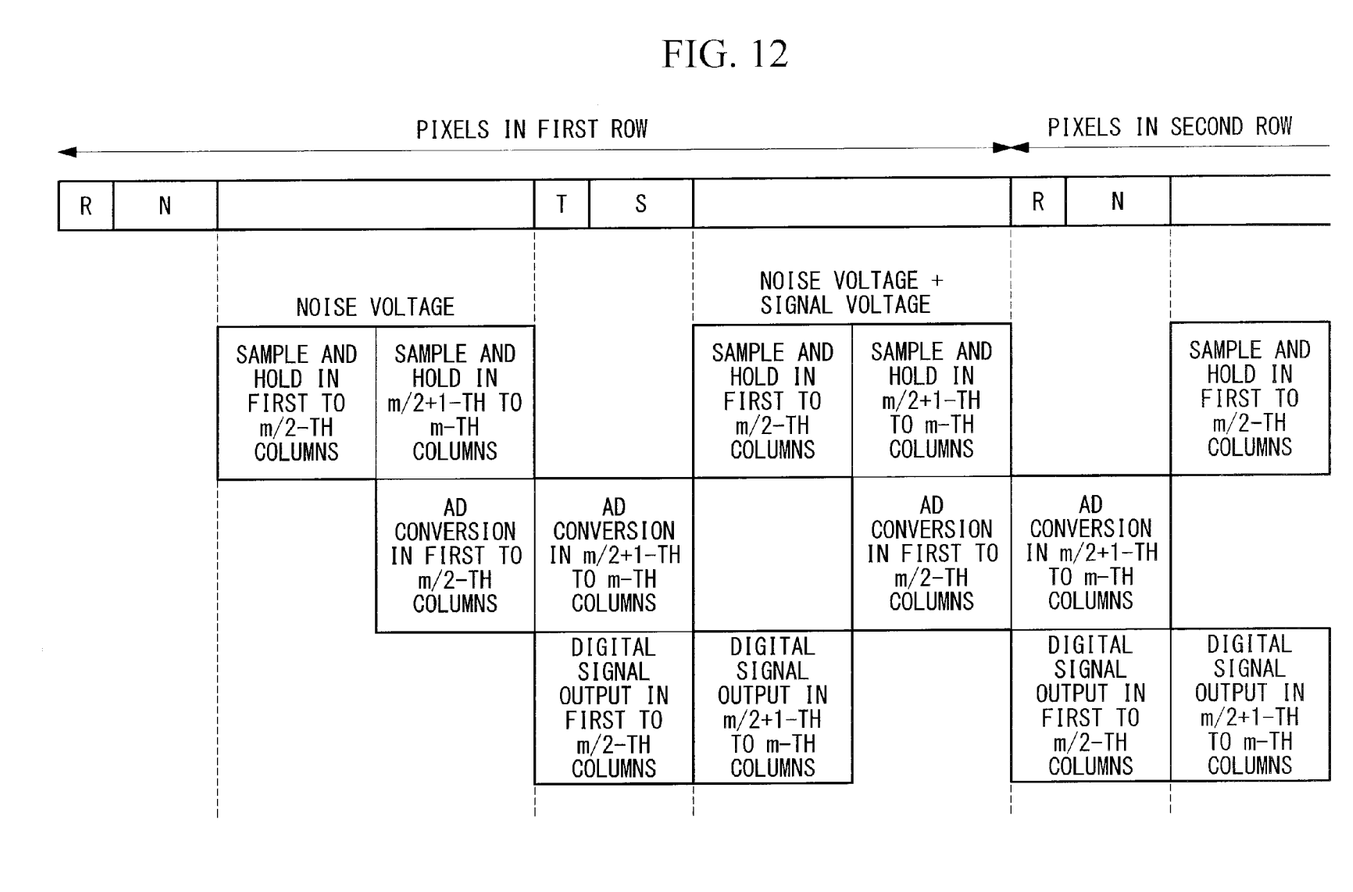
FIG. 12 is a timing chart illustrating a modification of an operation of the solid-state imaging device illustrated in FIG. 1.

The solid-state imaging device 100 may operate, as illustrated in FIG. 12. That is, an operation for outputting a voltage from the horizontal shift register 5 to the sample-and-hold circuit 12, a digital conversion operation, and an operation for outputting a digital signal are performed for the pixels 2 corresponding to the first to 2/m-th columns among the pixels 2 corresponding to m columns arranged in the pixel array 3. An operation is performed for the pixels 2 corresponding to the remaining (m/2+1)-th to m-th columns while being delayed step by step from the pixels 2 corresponding to the first to 2/m-th columns.

In the drawing, R denotes a period during which a voltage from the pixel 2 is reset to zero, N denotes a period during which a noise voltage of the pixel 2 after the reset is read out to the horizontal shift register 5, T denotes a period during which a signal charge stored by a photodiode provided in the pixel 2 is converted into a signal voltage Vin, and S denotes a period during which the signal voltage Vin and the noise voltage of the pixel 2 are read out to the horizontal shift register 5.

Thus, the pixels 2 are divided into halves by the columns and processed with a time difference so that the processing can be performed without interruption.

On the basis of the embodiment described above, inventions as follows are derived.

To attain the aforementioned object, the present invention provides the following means.

According to one aspect of the present invention, there is provided an analog-to-digital converter including a counter that counts clock signals in a predetermined direction and outputs a count signal, a ramp waveform signal generation unit that generates a ramp waveform signal based on the count signal, a plurality of signal conversion units, and a control unit that controls the signal conversion unit, in which each of the signal conversion units includes a sample-and-hold circuit that samples a voltage of an input signal and holds the sampled voltage, a successive approximation capacitance group that has a predetermined number of capacitances having different capacitance values that successively increase by a factor of two, and outputs bias voltages having different levels by changing connection of the capacitances, a voltage addition unit that outputs an addition voltage obtained by adding a voltage selected out of a voltage of the ramp waveform signal and the bias voltage and one of the voltage held by the sample-and-hold circuit and a predetermined referential voltage, and a comparison unit that compares a voltage not to be added serving as the other of the voltage held by the sample-and-hold circuit and the predetermined referential voltage and the addition voltage, and the control unit digitally converts the voltage held by the sample-and-hold circuit based on first digital data generated based on a result obtained by the comparison unit comparing, in a connection combination of the predetermined number of capacitances, the addition voltage obtained by the addition in the voltage addition unit with the bias voltage as the selected voltage with the voltage not to be added and second digital data generated based on a result obtained by the comparison unit comparing the addition voltage obtained by the addition in the voltage addition unit with the voltage of the ramp waveform signal as the selected voltage with the voltage not to be added while acquiring data for calibration of the successive approximation capacitance group based on the connection combination of the capacitances in the successive approximation capacitance group and the signal generated by the ramp waveform signal generation unit.

According to the aspect, the voltage held by the sample-and-hold circuit is compared with the plurality of bias voltages generated by the successive approximation capacitance group by the comparison unit so that its part is digitally converted using a successive approximation system, and is compared with the ramp waveform signal generated by the ramp waveform signal generation unit by the comparison unit so that the other part is digitally converted by a counter-ramp system. A digital signal of the voltage of the signal input to the sample-and-hold circuit is obtained from the two digital data.

In this case, the comparison unit compares the voltage having the known voltage value generated by the ramp waveform signal generation unit with the bias voltage generated by the capacitance in the successive approximation capacitance group, to obtain data for calibration including information about a variation in capacitance value among the capacitances. The data for calibration is used to compensate for digital data obtained by the conversion using the successive approximation system so that accurate digital data can be obtained.

According to the aspect, there is provided a solid-state imaging device including the analog-to-digital converter described above, and a pixel unit having a plurality of pixels arranged therein in a matrix shape, in which the plurality of signal conversion units is provided to correspond to columns of pixels in the pixel unit.

Advantageous Effects of Invention

According to the present invention, in an analog-to-digital converter that performs analog-to-digital conversion processing in a plurality of steps, an effect of obtaining accurate digital data while using a successive approximation system is produced.

REFERENCE SIGNS LIST 1 analog-to-digital converter
2 pixel
3 pixel array (pixel unit)
4 vertical shift register
5 horizontal shift register
6 wiring
7 memory circuit
8 parallel-serial conversion circuit
9 serial digital output circuit
10 power supply circuit
11 pulse generation circuit 12 sample-and-hold circuit (signal conversion unit)
13 signal conversion circuit (signal conversion unit)
14 ramp waveform generation circuit (ramp waveform signal generation unit)
15 counter circuit (counter)
16 DAC circuit (successive approximation capacitance group, voltage addition unit)
17 comparator (comparison unit)
18 control circuit (control unit)
19 latch circuit
20 to 26 capacitance
100 solid-state imaging device
100a, 100b, 100c semiconductor substrate
SWin, SW0 to SW6 switch
Vin signal voltage
Vref reference voltage
$V_0$ referential voltage
Vramp ramp voltage (ramp waveform signal)

The invention claimed is:

1. An analog-to-digital converter comprising:
   a counter that counts clock signals in a predetermined direction and outputs a count signal;
   a ramp waveform signal generation unit that generates a ramp waveform signal based on the count signal;
   a plurality of signal conversion units; and
   a control unit that controls the signal conversion unit,
   wherein each of the signal conversion units includes
   a sample-and-hold circuit that samples a voltage of an input signal and holds the sampled voltage,
   a successive approximation capacitance group that has a predetermined number of capacitances having different capacitance values that successively increase by a factor of two, and outputs bias voltages having different levels by changing connection of the capacitances,
   a voltage addition unit that outputs an addition voltage obtained by adding a voltage selected out of a voltage of the ramp waveform signal and the bias voltage and one of the voltage held by the sample-and-hold circuit and a predetermined referential voltage, and
   a comparison unit that compares a voltage not to be added serving as the other of the voltage held by the sample-and-hold circuit and the predetermined referential voltage and the addition voltage, and
   the control unit digitally converts the voltage held by the sample-and-hold circuit based on first digital data generated based on a result obtained by the comparison unit comparing, in a connection combination of the predetermined number of capacitances, the addition voltage obtained by the addition in the voltage addition unit with the bias voltage as the selected voltage with the voltage not to be added and second digital data generated based on a result obtained by the comparison unit comparing the addition voltage obtained by the addition in the voltage addition unit with the voltage of the ramp waveform signal as the selected voltage with the voltage not to be added while acquiring data for calibration of the successive approximation capacitance group based on the connection combination of the capacitances in the successive approximation capacitance group and the signal generated by the ramp waveform signal generation unit.

2. A solid-state imaging device comprising:
   the analog-to-digital converter according to claim 1; and
   a pixel unit having a plurality of pixels arranged therein in a matrix shape,
   wherein the plurality of signal conversion units is provided to correspond to columns of pixels in the pixel unit.

* * * * *